United States Patent [19]

Kalat

[11] Patent Number: 4,511,069
[45] Date of Patent: Apr. 16, 1985

[54] DISPENSING SYSTEM

[75] Inventor: Edwin F. Kalat, Thomaston, Conn.

[73] Assignee: The Pharmasol Corporation, Randolph, Mass.

[21] Appl. No.: 465,689

[22] PCT Filed: Jun. 2, 1982

[86] PCT No.: PCT/US82/00748
§ 371 Date: Jan. 17, 1983
§ 102(e) Date: Jan. 17, 1983

[87] PCT Pub. No.: WO82/04203
PCT Pub. Date: Dec. 9, 1982

Related U.S. Application Data

[63] Continuation-in-part of Ser. No. 270,554, Jun. 4, 1981, abandoned.

[51] Int. Cl.³ .................. B05B 9/04; B65D 83/14
[52] U.S. Cl. ................................. 222/263; 222/321
[58] Field of Search ............ 222/263, 321, 380; 239/329, 331, 333

[56] References Cited

U.S. PATENT DOCUMENTS

| | | | |
|---|---|---|---|
| 3,211,346 | 12/1965 | Meshberg | 222/263 X |
| 4,025,046 | 5/1977 | Boris | 222/321 X |
| 4,122,982 | 10/1978 | Giuffredi | 222/321 |
| 4,230,242 | 10/1980 | Meshberg | 222/321 |
| 4,271,875 | 6/1981 | Meshberg | 222/385 X |
| 4,322,020 | 3/1982 | Stone | 222/321 X |

FOREIGN PATENT DOCUMENTS 2285815  4/1975  France .
2391374 10/1977  France .

*Primary Examiner*—Joseph J. Rolla
*Assistant Examiner*—Frederick R. Handren
*Attorney, Agent, or Firm*—Robert E. Meyer

[57] ABSTRACT

A system for metered dispensing of a product comprising a hermetically-sealed package containing sealed therein product to be dispensed, together with a pressurizing agent and a pump for dispensing the product. The pump discharge pressure of which is substantially independent of the internal pressure of said package.

11 Claims, 18 Drawing Figures

DISPENSING SYSTEM

This application is a continuation-in-part of Applicants prior copending application Ser. No. 270,554, filed June 4, 1981 (now abandoned).

TECHNICAL FIELD

There are currently several methods to dispense liquids with fine spray patterns. Historically, the accepted method for spraying liquid products with fine spray patterns such as colognes was to dispense these products from an aerosol. The conventional aerosol was capable of producing extremely fine particles in the air, and in addition was hermetically sealed which obviated product breakdown, generally attributed to oxidation of specific fragrance notes.

About four years ago, the aerosol industry in the United States was banned from using chlorofluorocarbons as a propellant source. Governmental regulations prohibited the use of the chlorofluorocarbon propellant in aerosols since they were allegedly involved with Ozone depletion in the upper atmosphere. The chlorofluorocarbons had enjoyed many years of widespread use for many aerosol products, and were particularly useful in colognes, pharmaceuticals, and ingestibles. The chlorofluorocarbons were stable, had a low order of toxicity, had no odor, were available as blends at several pressures, were readily available at reasonable cost, and above all, were non-flammable.

With the enforcement of the chlorofluorocarbon ban, it became necessary to utilize other propellant sources. Of the remaining propellants available to the aerosol industry, the hydrocarbon liquified gases came into greater prominence. Through the years, hydrocarbon blends had been used for aerosol water-based, household chemical specialty products, such as cleaners, waxes, deodorants, and insecticides. Although pure isobutane, normal butane and propane can be used, it is preferable to use blends of butane, isobutane and propane in order to obtain desired vapor pressures.

While hydrocarbon propellants apparently do not interfere with the Ozone layer, they do possess some less desirable properties. For example, although hydrocarbon toxicity is good, the hydrocarbons generally possess low flash points which, when coupled with the alcohol base used in most perfume concentrates, render these formulations more hazardous as to flammability than their predecessor chlorofluorocarbon formulations.

The fragrance market has recently turned to spray pump dispensers as alternatives to aerosols. Previously, pumps were used successfully on chemical specialty cleaners to dispense formulations with coarse, wet sprays. It was now a challenge for the mechanical pump manufacturers to refine and engineer their product line to accommodate dispensing of expensive fragrance products. Several pump manufacturers met the challenge by designing and manufacturing pumps for this market. With these pumps cologne and perfume could now be dispensed from a glass bottle with no hydrocarbon propellant, with little to no extra cost, and without added flammability or explosive properties. In addition, the pump dispensed products could be packaged on existing filling equipment. However, one disadvantage with these pumps was the feature common to all pumps, air enters the package on each stroke. This results in fragrance deterioration attributed to oxidation of certain fragrance notes. This short-coming in package integrity affected the quality and shelf-life of fragrances.

The utility of this novel sealed dispensing system is of course not limited to fragrances such as perfume or cologne. Practically any product that can be dispensed by pump or aerosol can be dispensed using this system. Of particular importance, of course, are those products which are preferably retained in a sealed environment such as, for example, pharmaceuticals which can be dispensed in measured dosages without destroying the sterility of the remaining portions.

The purpose of this invention is to provide a novel sealed dispensing system as an alternative to conventional pumps and aerosols. This system will obviate certain shortcomings inherent in both these packages. Comparison of this system of the invention with metered aerosols, conventional aerosols, and pumps is described in Table 1 below.

TABLE 1

COMPARISON OF VARIOUS FEATURES OF TRADITIONAL AEROSOLS AND PUMPS WITH THE DISPENSING SYSTEM OF THE INVENTION

| FEATURE | METERED AEROSOL | CONTINUOUS AEROSOL | PUMPS INCLUDING THROTTLING AND NON-THROTTLING | DISPENSING SYSTEM OF THE INVENTION |
|---|---|---|---|---|
| Package is hermetically sealed | yes | yes | no | yes |
| Internal pressure level | high | high | none | low |
| Product formulation adjustment required | yes | yes | no | no |
| Contents can be pressurized by: | | | | |
| Pressure filling | yes | yes | N.A. | yes |
| Impact filling | yes | yes | N.A. | yes |
| Sparging | yes (atmospheric) | yes (atmospheric) | N.A. | yes |
| Cold filling | yes | yes | N.A. | yes |
| Priming required prior to initial operation | no | no | yes | no |
| Total Environmental Acceptability | no | no | yes | yes |
| Ability to accept water in solution | ltd. | ltd. | unltd. | unltd. |
| Open to bacterial Contamination | no | no | yes | no |
| Ability to dispense sterile solution | yes | yes | no | yes |
| Ability to dispense aqueous sterile | no | no | no | yes |

TABLE 1-continued

COMPARISON OF VARIOUS FEATURES OF TRADITIONAL AEROSOLS
AND PUMPS WITH THE DISPENSING SYSTEM OF THE INVENTION

| FEATURE | METERED AEROSOL | CONTINUOUS AEROSOL | PUMPS INCLUDING THROTTLING AND NON-THROTTLING | DISPENSING SYSTEM OF THE INVENTION |
|---|---|---|---|---|
| solution | | | | |
| Susceptibility to oxidation of contents | none | none | yes | none |
| Spray characteristics: | | | | |
| particle size | very fine | fine | fine | fine |
| consistency | very good | depends on duration of spray | very good for non-throttling Depends on method of depressing in throttling | very good |
| pattern | well defined | not well defined | well defined | well defined |
| Self venting | no | no | N.A. | yes |

BACKGROUND

In the period since the application was originally filed a number of references, some prior art, some not, have been called to Applicant's attention which appear to be at least as significant as Meshberg U.S. Pat. No. 3,211,346, issued Oct. 12, 1965, which was discussed in detail in this application as originally filed. These are Giuffredi U.S. Pat. No. 4,122,982, issued Oct. 31, 1978 based on an Italian application filed Mar. 16, 1976; Giuffredi French Certificate of Utility No. 77.33140 (Publication No. 2,391,374) based on an Italian application filed Oct. 27, 1977 and Meshberg U.S. Pat. No. 4,271,875, issued June 9, 1981. All four disclose pumps used in connection with sealed (non-venting) and pressurized containers. Both Meshberg patents show pumps which are actuated by position not by pressure, while the valve stem in each is in its undischarged position. A port connects the discharge chamber with the interior of the container. As the stem is depressed, this port is closed sealing the discharge chamber. Upon further depression of the stem, a second discharge port is uncovered permitting the discharge of the fluid contained in the discharge chamber. Upon release of the stem, the discharge chamber remains in contact with the discharge passage until the discharge port is again covered permitting the contents of the discharge passage and air to enter the discharge chamber. It is only when the stem is substantially in its undepressed position that contact with the container is reestablished.

In the two Giuffredi patents while the discharge is pressure actuated, the refilling of the discharge chamber is position actuated like in Meshberg.

Other references considered to be less relevant since they are all used with vented containers, include:

When the refill valve is moved on the valve stem:

| Patentee | U.S. Pat. No. | Issued |
|---|---|---|
| Pechstein | Re. 28,366 (3,399,836) | Sept. 3, 1986 |
| Anderson | 4,051 983 | Oct. 4, 1977 |
| Bennett | 4,088,425 | May 9, 1978 |
| Hafele et al | 4,089,442 | May 16, 1978 |
| Majima | 4,140,249 | Feb. 20, 1979 |
| Umstead | 4,179,049 | Dec. 18, 1979 |
| O'Neill et al | 4,189,064 | Feb. 19, 1980 |
| Monden | 4,262,823 | Apr. 21, 1981 |
| Kirk, Jr. | 4,278,189 | July 14, 1981 |

And where the refill valve is stationary:

| Boris | 3,746,260 | July 17, 1973 |
|---|---|---|
| Nozawa et al | 3,908,870 | Sept. 30, 1975 |
| Kondo | 3,921,861 | Nov. 25, 1975 |
| Kishi et al | 4,017,031 | April 12, 1977 |
| Corsette | 4,050,613 | Sept. 27, 1977 |
| Boris | 4,028,222 | April 4, 1978 |
| Hayes | 4,111,367 | Sept. 5, 1978 |
| Kishi | 4,144,987 | March 27, 1979 |
| Kirk, Jr. | 4,154,374 | May 15, 1979 |
| Pettersen | 4,173,297 | Nov. 6, 1979 |
| Blake | 4,183,449 | Jan. 15, 1980 |
| Giuffredi | 4,215,804 | Aug. 5, 1980 |
| Ruscitti | 4,228,931 | Oct. 21, 1980 |
| Tada et al | 4,234,127 | Nov. 18, 1980 |
| Cater | 4,274,560 | June 23, 1981 |

DISCLOSURE OF INVENTION

The invention as herein illustrated comprises a system for metered dispensing of a product comprising a hermetically-sealed package containing sealed therein product to be dispensed together with an internal pressurizing agent, and means for dispensing the product, wherein: the hermetically-sealed package contains a product to be dispensed having solubilized therein a portion of the pressurizing agent and a headspace containing the remainder of the pressurizing agent. This means for dispensing the product from the package comprises a discharge chamber, a piston movable from one position to another to produce hydraulic pressure, $P^1$, in the discharge chamber, an exit passage from the discharge chamber, and means including a spring in combination with a seal forming a valve for providing communication from the discharge chamber to the exit passage when the hydraulic pressure $P^1$ in the discharge chamber reaches a predetermined level $P^3$. This spring in combination with the seal provides for blocking communication from the discharge chamber to the exit passage when the pressure $P^1$ in the discharge chamber drops below said predetermined level $P^3$. Ball valve means are provided for controlling flow from the package to the discharge chamber. The ball valve means blocks flow of product between the package and the discharge chamber while the hydraulic pressure $P^1$, in the discharge chamber exceeds the internal pressure $P^2$, in the package, but is responsive to the reduction of hydraulic pressure $P^1$, following the discharge of product from the discharge chamber to a value less than $P^2$ to allow additional product from the package into the discharge chamber. This permits the piston to return to its initial position upon the influence of the spring. The system is then ready to be actuated once again.

$P^1$, $P^2$, $P^3$

Discharge pressure $P^3$-the pressure at which the valve opens providing communication between the discharge chamber and the exit passage—can range from between about 20 and about 190 pounds per square inch (2.3 to about 14 atmosphere). Desirably, the discharge pressure $P^3$ should be from between 80 and about 120 pounds per square inch (5.4 and about 9.2 atmosphere). It should be noted that for optimum performance the difference between the discharge pressure $P^3$ and internal pressure $P^2$ is about 15 and 100 pounds per square inch (about 2 to 8 atmosphere). A particularly preferred difference in these pressures is between about 60 and 80 pounds per square inch (about 5 to 6.5 atmosphere). Pressure $P^1$, the internal pressure in the discharge chamber is developed by applying an external force to the actuator. Pressure $P^1$ varies between internal pressure $P^2$ and discharge pressure $P^3$. Discharge pressure $P^3$ is constant as will be shown below and is independent of the amount of external force or the speed at which the actuator is depressed and more importantly is independent of internal pressure $P^2$.

The internal pressure $P^2$ is provided by the pressurizing agent which is added to the product in the hermetically sealed package or container. The pressurizing agent is a material which preferably is at least partially solubilized in the product and which generates a pressure $P^2$ in the head space of the package in the order of 1 to 40 pounds per square inch and preferably approximately 20 pounds per square inch at the temperature at which the product is to be dispensed. The package is only partially filled to leave a head space above the fluid level of between 10 and 50 percent and preferably about 20 percent of the total volume of the container. The pressurizing agent may be hydrogen, carbon dioxide, nitrous oxide, hydrocarbons, halogenated hydrocarbons, oxygenated substances, and mixtures thereof as described in detail below.

THE DISPENSER

The discharge chamber is defined by a housing hermetically sealed onto the package and comprises that area filled with product between the exit orifice and the bottom of the housing. The valve and piston are located in the discharge chamber in addition to the product to be dispensed.

The piston extends into the discharge chamber through an opening therein surrounded by a sealing element and is provided at its externally extending end with an actuator by means of which the piston can be depressed. A spring acting through the discharge valve yieldably opposes the depression of the piston and operates to return first the discharge valve and then the depressed piston to their undepressed position. The means for providing communication from the discharge chamber to the exit passage is a discharge valve element movable in unison with the piston as the latter is depressed and relative thereto when the internal pressure $P^1$ in the discharge chamber reaches a predetermined level, discharge pressure $P^3$. The means providing communication from the package to the discharge chamber is an intake chamber in the discharge valve body having communication with the package through an opening at the lower end of the intake chamber and provided with a normally-closed intake valve which is displaceable from its seat when the internal pressure $P^2$ in the package exceeds the internal pressure $P^1$ in the discharge chamber. It should be noted that said normally-closed valve will also be opened during the package filling step as described in detail below. The intake chamber is contained in the lower end of the discharge valve body and is movable in unison with the piston and relative thereto. The opening at the lower end of the discharge chamber is surrounded by a hollow stem extending inwardly from the end and the intake chamber in the discharge valve body has at its lower end an opening dimensioned to have sliding engagement with the exterior surface of the stem. The spring is positioned in compression between a shoulder on the stem and the upper end of the intake chamber and the stem is provided with a protrusion dimensioned to engage and unseat the ball valve when the actuator is positioned at a predetermined position to place the exit passage in the piston directly in communication with the intake chamber, and, hence, the opening at the bottom of the discharge chamber. The actuator is secured to the exteriorly extending portion of the piston in a position to limit the depression of the piston during dispensing to a position less than that necessary to unseat the ball valve. Releasing the actuator after spraying permits the spring force to return the piston and valve in unison to the undepressed position while product simultaneously is forced into the discharge chamber for the next actuation.

BRIEF DESCRIPTION OF THE DRAWINGS

The invention will now be described in greater detail wherein.

BEST MODE OF CARRYING OUT THE INVENTION

Figure 1:
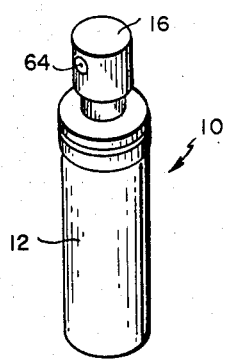
FIG. 1 is a perspective view of a preferred package of the invention.
Figure 2:
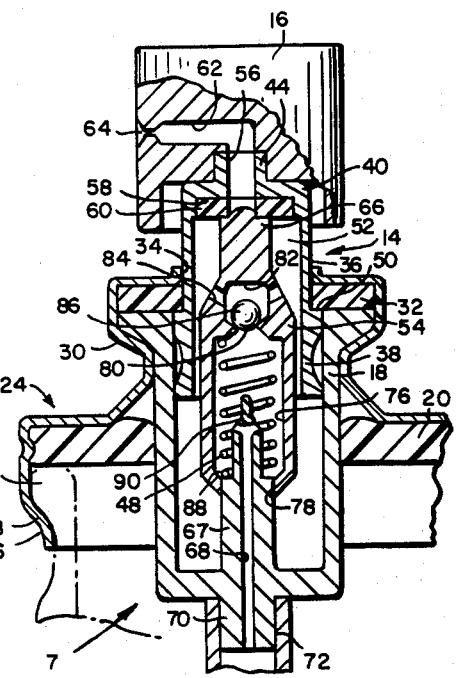
FIG. 2 is a fragmentary diametral section of the upper part of the package shown in FIG. 1 to much larger scale showing the components in an undepressed, at rest position.
Figure 3:
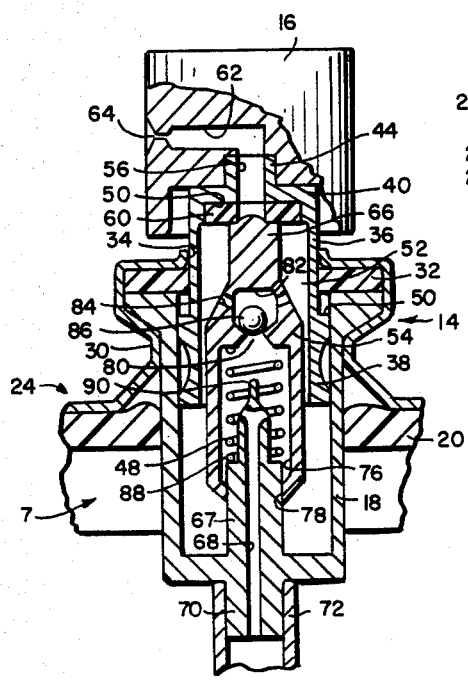
FIG. 3 is a view similar to FIG. 2 showing the structure in a partially depressed position just before discharge takes place.

Referring to the drawings, the typical system of the invention comprises a package 10 comprised of a receptacle 11 containing the product to be dispensed, together with a pressurizing agent and dispensing means 14 hermetically sealed in the receptacle.

The pressurizing agent is partially solubilized in the product and a headspace 7 is provided containing the remainder of the pressurizing agent.

The package is provided with an actuator 16 for effecting discharge of the product, independent of the internal pressurization $P^2$. This is achieved by means of variable hydraulic pressure $P^1$ which is generated in a discharge chamber 52 by piston 36 and which effects discharge when it reaches a predetermined discharge pressure $P^3$.

The housing 18 is positioned at the open end of the receptacle 12 and substantially centered therein with a portion extending into the receptacle and a portion extending from the receptacle through a sealing ring 20 held against the upper edge 22 of the receptacle by a ferrule 24, the lower edge of which is crimped at 26 beneath a shoulder 28.

The ferrule 24 defines a dome 30 within which the upper end of the housing 18 is crimped against a sealing ring 32 surrounding an opening 34 in the ferrule.

The piston 36 is positioned in the housing 18 with a portion 38 extending into the housing and a portion 40 extending from the housing for reciprocal movement in the housing and, for this purpose, there is provided an extension 44 to which there is applied the actuator 16. Depression of the piston is effected by pressing downwardly on the actuator 16. Restoration of the piston to its undepressed position is provided for by a spring 48. The lower part 38 of the piston corresponds substantially to the inside diameter of the housing and is provided with a shoulder 50, which, in the undepressed position of the piston, has sealing engagement with the sealing ring 32.

The piston 36 defines a hollow chamber 52 within which there is a valve 54 movable with the piston and relative thereto. The stem 44 of the piston contains a discharge passage 56, one end of which is in communication with the chamber 52 by way of a valve seat 58 surrounded by a sealing ring 60 and the other end of which is in communication with a lateral passage 62 in the actuator which terminates in a discharge orifice 64. The discharge passage 56 is normally closed by the valve 54 which has a part 66 structured to have sealing engagement with the sealing ring 60. The valve 54 is held yieldably engaged in a position of engagement of the part 66 with the valve seat by the aforementioned spring 48 and when so positioned, communication between the discharge passage 56 and the chamber 52 is blocked. By moving the valve 54 relative to the piston 36 the part 66 may be disengaged from the sealing ring 60 to provide communication between discharge passage 56 and the chamber 52 and hence discharge of product through the discharge passage 56, lateral passage 62 and orifice 64.

At the lower end of the housing 18 there is a hollow stem 67 which extends from the bottom of the housing chamber upwardly therein, defining an induction passage 68 which is in communication with the interior of the receptacle. An extension 70 of the stem 67 from the lower end of the chamber downwardly may be provided for receiving the upper end 72 of a dip tube 74, the lower end of which extends substantially to the bottom of the receptacle. The valve 54 has at its lower part an intake chamber 76, the lower end of which is provided with an opening 78 which has sliding engagement with the exterior surface of the stem 67. The upper end of the intake chamber 76 contains a port 80 and valve chamber 82 which is connected by ports 84 to the chamber 52. A ball valve 86 within the chamber 82 normally rests in a closed position on the port 80.

The spring 48 heretofore mentioned is positioned in compression within the intake chamber 76 with its lower end seated on a shoulder 88 at the upper end of the stem 67 and its upper end is seated against the upper end of the intake chamber 76 and holds the piston 36 and valve 54 in their undepressed position with the valve stem part 66 engaged with the sealing ring 60. Desirably, there is an extension 90 at the upper end of the stem 67 dimensioned to extend through the port 80 when the piston is almost fully depressed to unseat the ball 86 for a purpose which will be described hereinafter.

Figure 7:
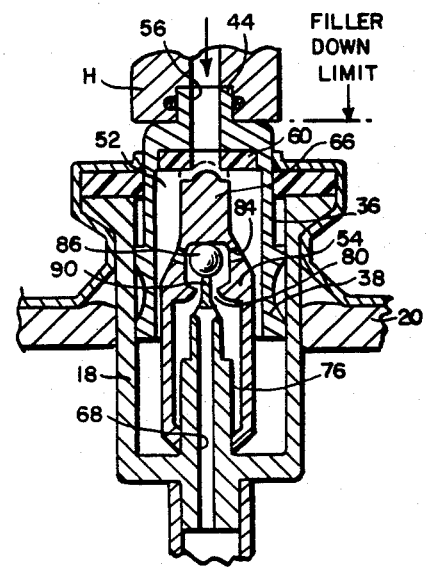
FIG. 7 is a fragmentary section showing the position of the parts when filling the package by impact or pressure gassing.

The extension 90 is provided for impact filling as shown in FIG. 7 wherein the discharge head H of a filling machine is shown applied to the extension 44 and pressed downwardly sufficiently to displace the piston 36 and valve 54 downwardly in the housing 18 and to effect relative movement of the valve 54 and the piston so as to unseat the valve from the discharge passage and to cause the extension 90 to lift the ball valve 86 off its seat. In this position product and/or pressurizing agent can be forced into the chamber 52 and from thence through ports 84 and 80 into the chamber 76 and passage 68 into the receptacle. If impact filling is not employed, it is not necessary to have the extension 90.

Figure 5:
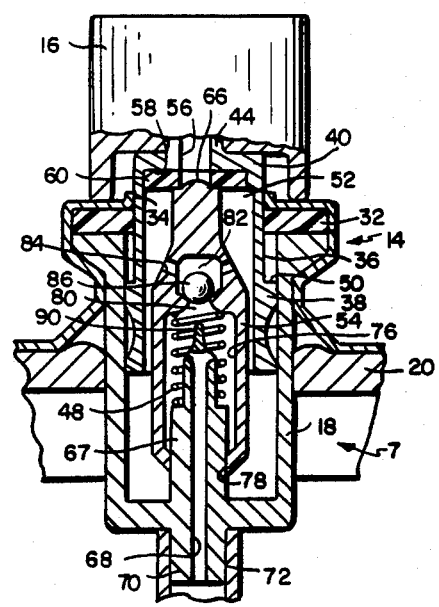
FIG. 5 is a section corresponding to FIG. 3 showing the completely depressed position of the parts following discharge.
Figure 6:
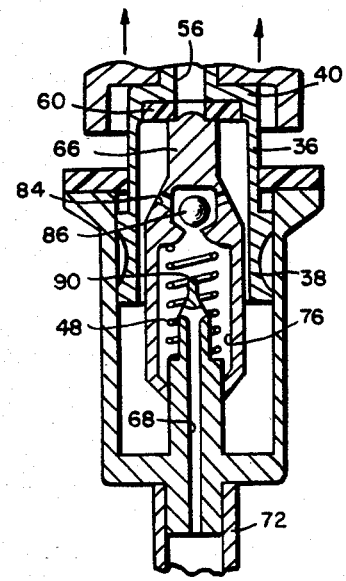
FIG. 6 is a fragmentary section showing the parts in a position just prior to gas being injected.

The depression of the piston must be limited so as not to unseat the ball valve during actuation and this may be accomplished by positioning the actuator 16 on the extension 44 so that its contact with the dome of the ferrule prevents movement downwardly beyond the position shown in FIG. 5.

In operation, the system of the invention can be described as follows: Assuming that there is product in the discharge chamber, downward movement is applied to the piston by pressing on the actuator 16. Such downward movement applies hydraulic pressure $P^1$ to the product in the housing 18 by decreasing the volume therein. During the initial downward movement, the piston and the valve move in unison. However, when the hydraulic pressure $P^1$ in the chamber 52 reaches a predetermined level $P^3$ the resistance of the spring 48 will be overcome, whereupon the valve will move downwardly relative to the piston, thus withdrawing valve stem part 66 from the valve seat at the entrance to the discharge passage and product will be discharged at the discharge pressure $P^3$, through the discharge passage 56, passage 62 and orifice 64. Termination of the stroke of piston 36 results in a drop of the hydraulic pressure $P^1$ in the chamber 52 to a value less than discharge pressure $P^3$, whereupon the spring 48 moves the valve relative to the piston to reengage the valve stem part 66 with the entrance to the passage 56, thus cutting off further discharge. When actuator 16 is released spring 48 acting through valve stem part 66 causes the upward movement of the piston 36. Since the valve part 66 is in the closed position the increase in volume of discharge chamber 52 reduces pressure $P^1$. As soon as pressure $P^1$ is reduced to a value equal to pressure $P^2$ the product in receptacle 12 which is at pressure $P^2$ moves ball 86 away from port 80 permitting the product to flow through the intake chamber and ports 80 and 84 into the chamber 52 to fill the same. Thus, as the piston is ascending to its undepressed position, the product is filling the chamber 52. The product flow continues until the piston reaches its undepressed position. Until such time as the piston is reactivated pressure $P^1$ remains equal to $P^2$. The instant the piston is actuated pressure $P^1$ increases forcing ball 86 against port 80 thereby sealing the discharge chamber from the intake chamber. The intake chamber remains in constant contact with the interior of the receptacle. Although the amount of internal pressure $P^2$ in the container may decrease as product is dispensed and the headspace 7 increased, the fact that it is the reduction in pressure in chamber 52 that unseats ball 86 means that the chamber 52 will fill and piston 36 will return to the undepressed position under the influence of spring 48 independent of the value of $P^2$ even when $P^2$ is reduced to a value that is slightly subatmospheric. It is only when the pressure differential inside and outside of the piston exceeds the strength of the spring that the pump stops working. As shown in FIGS. 9 through 18 the discharge pressure $P^3$ of the pump is substantially independent of the internal pressure $P^2$ within the container. Hence the spray characteristics remain uniform throughout the entire use of the dispenser.

It is believed that the reason for this is that the intake chamber is located within the discharge chamber as part of the valve assembly and remains in constant communication with the interior of the receptacle. The pressure inside the intake chamber is always $P^2$ independent of the absolute value of $P^2$ and independent of the instantaneous value of $P^1$ and this pressure is exerted in all directions against the walls of the intake chamber thereby substantially cancelling out any directional effect.

Figure 8:
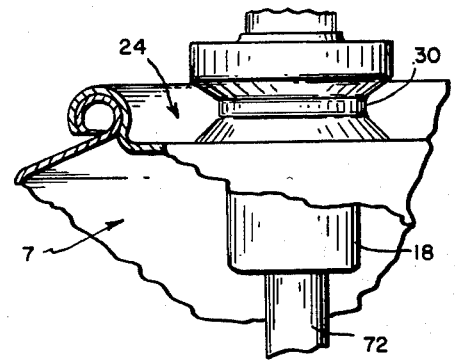
FIG. 8 is a fragmentary section wherein the package is metal and the closure is crimped to its upper open end.
Figure 4:
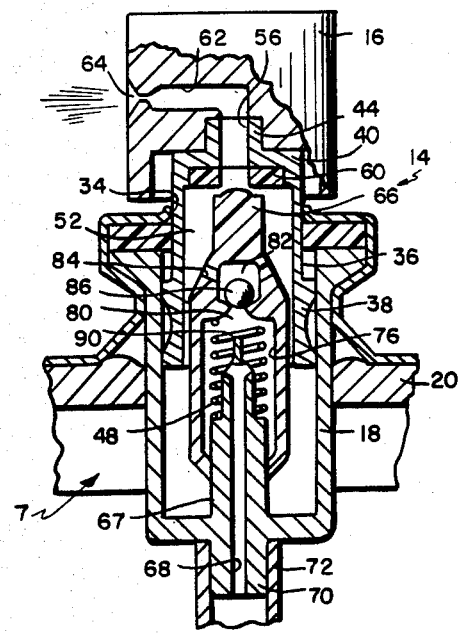
FIG. 4 is a section corresponding to FIG. 2 showing the position of the parts at discharge.

Instead of a glass or plastic container, a metal container may be used and when a metal container is used as shown in FIG. 8 the cap 24 is applied to the open top and clinched in place by rolling the top of the container and the skirt surrounding the cap.

As has been previously mentioned, the pressurizing agent may be totally or partially solubilized in the product. Ideally sufficient pressurizing material will be used so that upon exhaustion of the product in the package, the internal pressure $P^2$ in the package is still sufficient to drive the final contents of the package from the valve intake chamber into the discharge chamber when the ball valve 86 is displaced from its seat and to permit the piston to return to its undepressed position.

THE PRESSURIZING AGENT

As will be shown below, the product to be dispensed can range from a 100 percent aqueous formulation to a 100 percent non-aqueous formulation, plus various combinations thereof. The solubility in the product of the various pressurizing substances useful in this invention can be established by using the Ostwald coefficient. Calculation of the Ostwald coefficient is provided by the formula below:

$$\lambda = \left[ \frac{1}{x} \left( \frac{WRT}{V_c MP} \right) + X - 1 \right]$$

wherein:
$\lambda$ = Ostwald solubility coefficient
X = Volume of liquid/volume of container
W = Weight of pressurizing gas, grams
R = Gas constant 82.06 ml. at m./mole °K.
T = Kelvin temperature
$V_c$ = Volume of container in ml.
M = Molecular weight of the propellant
P = Total pressure in absolute atmospheres To obtain the grams of gas solubilized in the liquid contained in the specific container the formula is rearranged to read:

$$W = \frac{V_c MP}{RT} (\lambda X + 1 - X)$$

A specific application of this formulation to a container with a volume of 77.3 ml. pressurized with $CO_2$ shows that 0.72 grams of $CO_2$ is solubilized in the product:
$V_c$ Volume of container is = 77.3 ml.
Molecular weight of $CO_2$ (M) = 44

Pressure (P) = 2 atm (14.7 psig)

R = 82.06

T = (273° C. + 21.1° C.) = 294.1° K.

X = 0.85 (85% of filled container 15% headspace)
$\lambda$ = 2.84 from chart
Placing these values in the formula: The weight W of $CO_2$ solubilized in the liquid present in the container with a 15 percent headspace is 0.72 grams.

Figure 9:
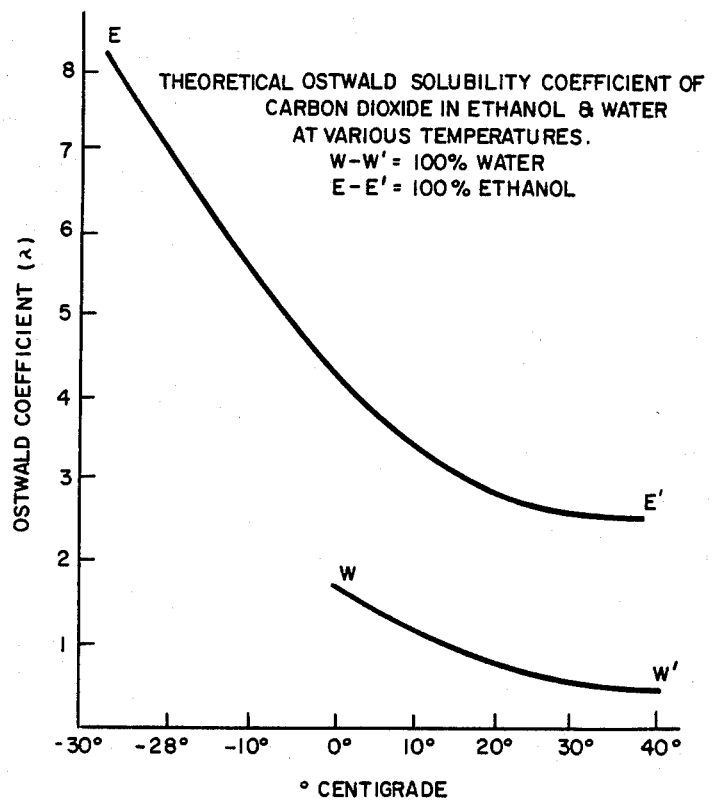
FIG. 9 is a graph of the theoretical Ostwald solubility coefficient of carbon dioxide in ethanol and water at various temperatures.

FIG. 9 of the drawings illustrates the Ostwald solubility coefficient of carbon dioxide in 100 percent water W—W' plus 100 percent ethanol E—E' at various temperatures. Solubilized mixtures of ethanol and water with $CO_2$ will produce Ostwald coefficients with values falling between the curves W—W' and E—E'.

Figure 10:
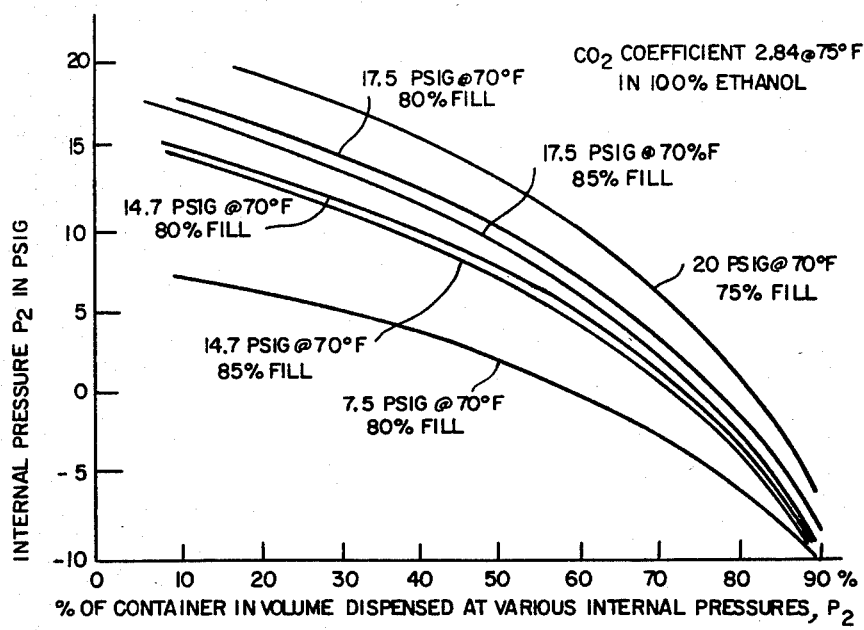
FIG. 10 is a graph plotting the percent of container dispensed against the internal pressure $P^2$ wherein the pressurizing agent is $CO_2$ and the product dispensed is 100 percent ethanol at various levels.

FIG. 10 illustrates the theoretical percent of container volume dispensed at various internal pressures $P^2$, the Ostwald coefficient for the product dispensed, 100 percent ethanol is 2.84 at 24° C.

Figure 11:
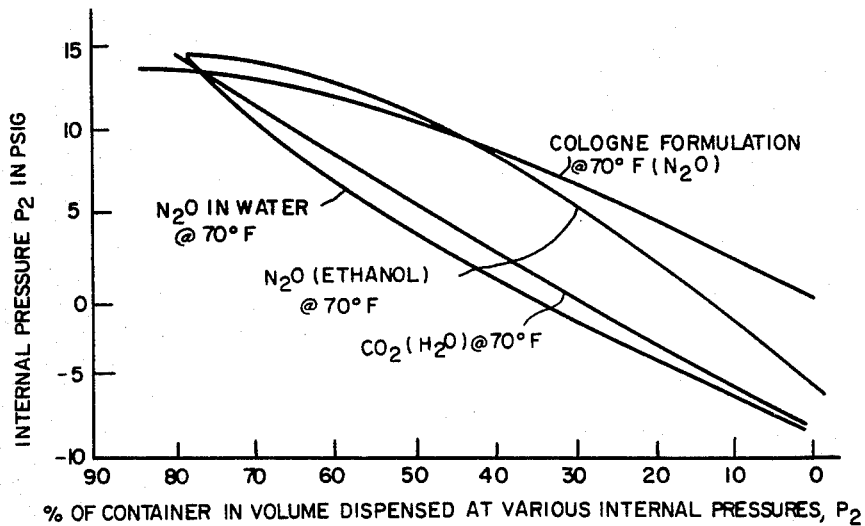
FIG. 11 is a graph similar to FIG. 10 wherein the pressurizing agents are $CO_2$ and $N_2O$ and the products to be dispensed are water and ethanol, respectively.
Figure 12:
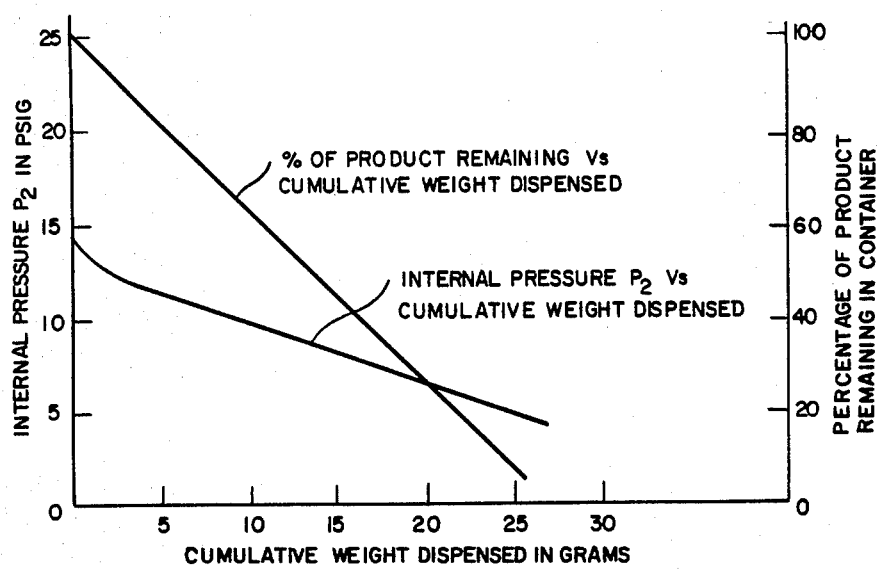
FIG. 12 is a graph showing the cumulative weight in grams plotted against internal pressure $P^2$ in PSIG where the pressurizing agent $CO_2$ is solubilized in alcohol sparged at 20° F. and dispensing takes place at 70° F.
Figure 13:
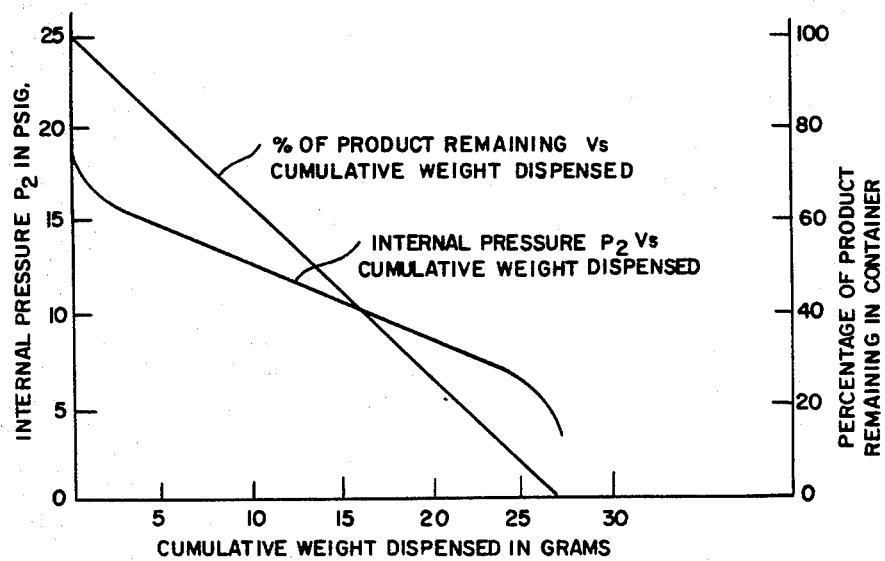
FIG. 13 is a graph similar to FIG. 11 wherein the pressurizing agent $CO_2$ is solubilized in alcohol sparged at 10° F. and dispensing takes place at 70° F.
Figure 14:
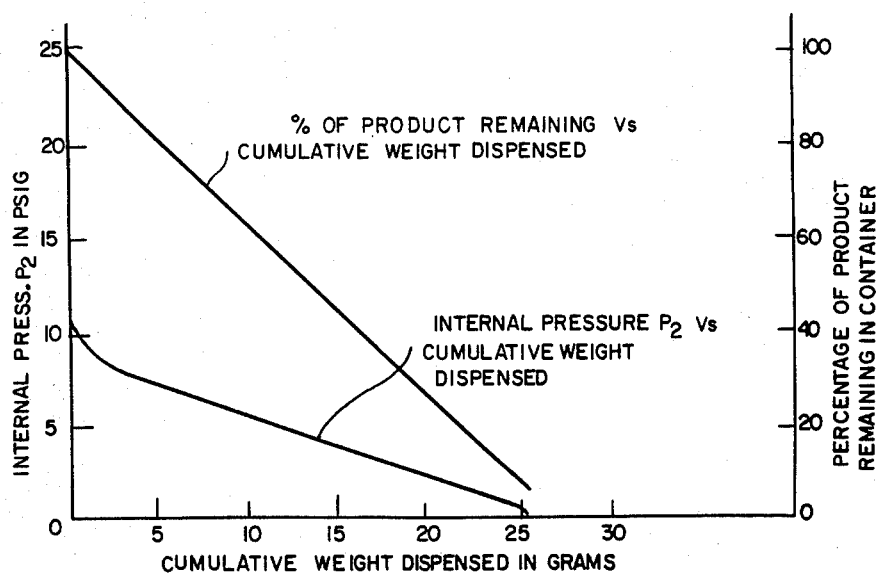
FIG. 14 is a graph like FIG. 11 wherein the pressurizing agent $CO_2$ is solubilized in alcohol sparged at 40° F. and dispensing takes place at 70° F.
Figure 15:
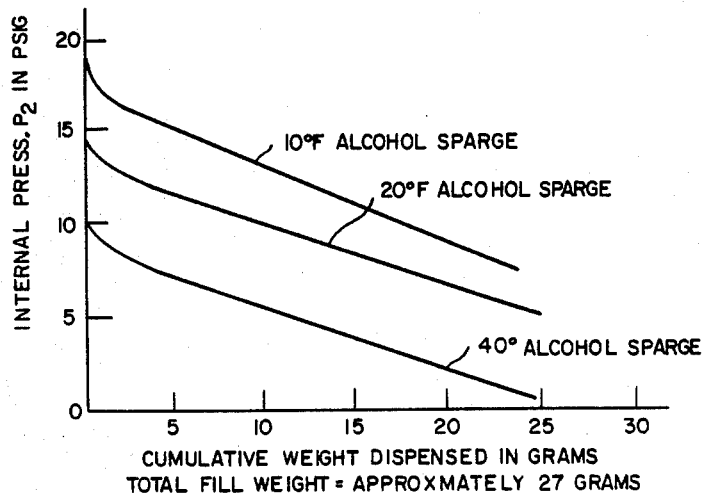
FIG. 15 is a graph showing the cumulative weight dispensed plotted against internal pressure $P^2$ in pounds per square inch gauge wherein the pressurizing agent $CO_2$ is solubilized in alcohol at 10° F., and 20° F. and 40° F.

FIG. 11 shows actual percent of container volume dispensed where various products are charged with carbon dioxide and nitrous oxide having various Ostwald coefficients. These products are essentially 100 percent discharged.

It is herein emphasized that the system described above is hermetically sealed and, accordingly, not vented, as are conventional pump structures. The seals of this system are so arranged that once they are permanently placed on a container, they permit no exchange statically or dynamically of air from the outside of the package to the inside. If the package is exposed to high temperatures such as direct flame, $P^2$ will increase dramatically and alternately overcome the spring force and exhaust product until internal pressure in the package returns to less than the spring force. This "self-venting" feature of the system of the invention is unobvious and unexpected.

Ideally, those pressurizing agents that are non-toxic, non-flammable and environmentally acceptable which can be incorporated readily in the product are most preferred. With various water, alcohol and solvent-based formulations, carbon dioxide as the pressurizing agent has sufficient solubility therein such that the internal pressure can be controlled over a broad pressure range. This makes it a preferred pressurizing agent.

Suitable pressurizing agents for the purpose of this invention are defined as those substances which have the propensity to be "solubilized" in the product and which fills the headspace of the package with gas at various levels of fill including total discharge of product. Examples of pressurizing agents include:

A. Compressible, essentially soluble gases
   Examples: carbon dioxide, nitrous oxide and hydrogen
B. Essentially liquifiable petroleum gases (hydrocarbons)
   Examples: propane, butane, isobutane and propylene
C. Liquified halogenated hydrocarbons
   Examples: 1, 2 dichlorotetrafluorethane (114), Dichlorodifluoromethane (12), and Chlorodifluoromethane (22)
D. And the oxygenated substances such as ethers, dimethylether and diethylether The term "solubilized" as used in discussing the system of the present invention refers to the process of dissolving a gas in a liquid whether that liquid or gas be simple one-phase mixtures or emulsions, a dispersion or a multiple-phase mixture.

The limiting qualification on the range of $P^2$ can be defined as follows: The minimum must be sufficient to discharge the product in the package and the maximum must be less than the discharge pressure $P^3$ of the dispenser and is usually less than about 100 pounds per square inch.

PRESSURIZATION

Pressurization of the product may be accomplished in a number of ways including: 1. Pressure filling; 2. Impact filling; 3. Sparging, and 4. Cold sparging.

As to 1: Pressure filling is the expression applied to conventional aerosol filling where any type of liquified gas such as hydrocarbons or chlorofluorocarbons are metered with a volumetric pump directly into the container through the dispenser via an adapter. The liquid gas is kept hydrostatic and its delivery is very accurate. The liquified gas has a constant vapor pressure $P^2$.

As to 2: Impact filling is where the liquid concentrate has been prefilled into the container at room temperature and the dispenser placed on and crimped onto the container. The adapter is then engaged onto the dispenser and a high pressure charge of the soluble compressed gas such as $CO_2$ is injected through the dispenser into the container. The charge is considerably higher than the desired pressure $P^2$ because the pressure drops as the soluble compressed gas solubilizes with the liquid. As a very general rule, at normal filling speeds, the injection pressure is three times the final pressure desired $P^2$. For example, to achieve a $P^2$ of 30 pounds per square inch, we would set injection pressure at 90 pounds per square inch.

As to 3: In pressurizing by sparging, the room temperature contents are externally subjected to high pressure soluble gas ($CO_2$). The mixture is kept under pressure and pressure filled into the container often with an under-the-cap filler.

As to 4: Cold sparging is accomplished by reducing the temperature of the liquid contents externally. The soluble compressed gas is passed through the cold liquid where it is solubilized in the liquid. The liquid is filled into the containers under cold filling equipment—(refrigerated filling bowls)—for example. The gas is held in solution as a function of the temperature at atmospheric pressure. The lower the temperature, the more gas is held in solution.

DISPENSING

The unexpected dispensing characteristics of the system of the invention include: controlled volume dispensing over the entire contents of the package in combination with consistent spray characteristics, independent of changes in $P^2$.

Figure 16:
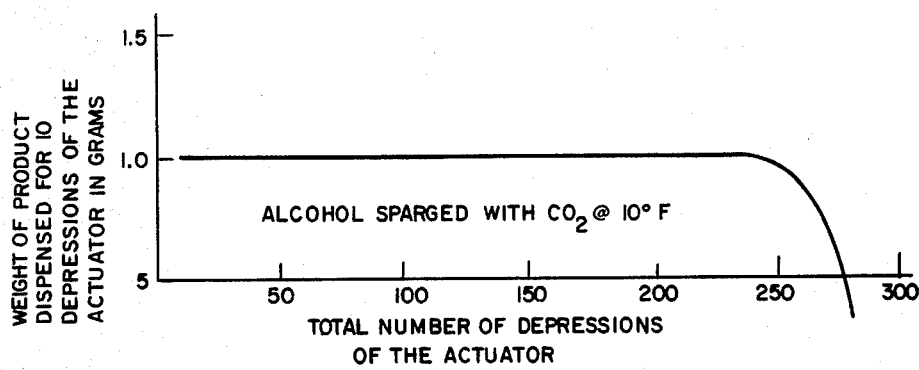
FIGS. 16, 17 and 18 are graphs showing the weight of product in grams dispensed per 10 depressions of the actuator and the pressurizing agent is $CO_2$ solubilized in alcohol sparged at 10° F., 20° F. and 40° F.
Figure 17:
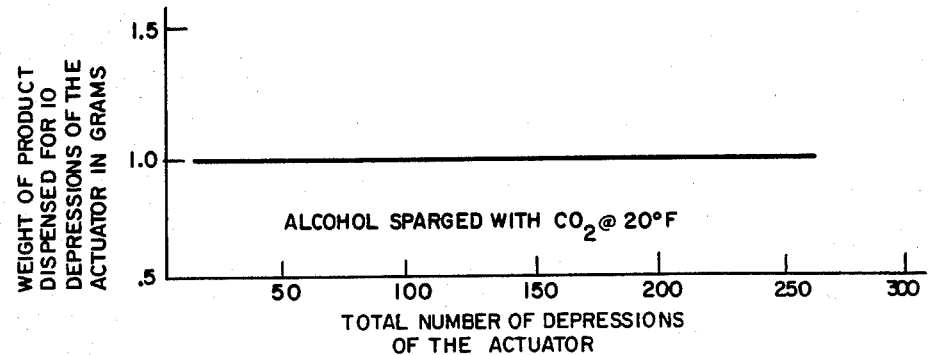
Figure 18:
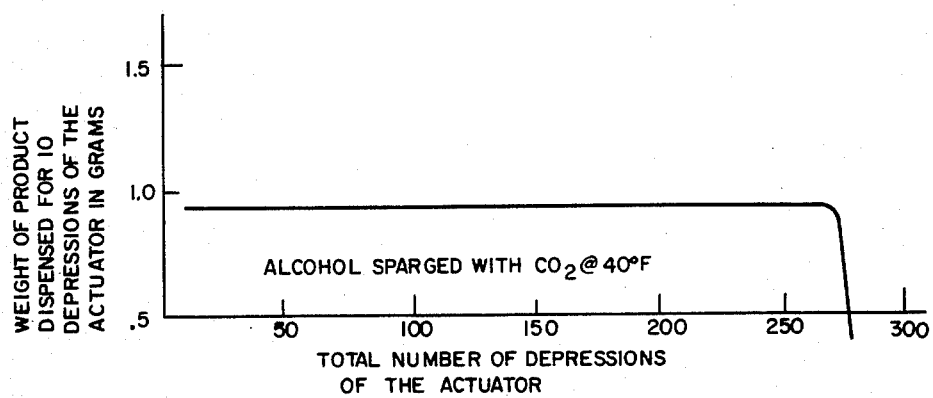

Specifically as to dosage—the metered dispensing system of the invention dispenses a controlled volume of product consistently as shown in FIGS. 16, 17 and 18.

In addition, the volume dispensed with each dosage can be controlled by the displacement of the discharge chamber. This can range from less than between about 25 microliters to one ounce or more. The spray characteristics of each dose dispensed can be influenced by the mechanical breakup in the exit orifice and/or the concentration of pressurizing agent in the product dispensed. The spray pattern can range from a very fine spray to a stream.

Specifically, as to spray characteristics, an overriding control on the spray characteristics is the designated discharge force $P^3$. There is a correlation between the level of hydraulic discharge pressure and spray breakup. Unexpectedly, these spray characteristics are essentially independent of temperature variations or changes in internal pressure $P^2$.

The performance of the system as herein described with respect to dispensing the entire contents of the package and dispensing at a substantially consistent rate are illustrated in FIGS. 12 to 15.

It can be appreciated that with certain pressurizing agents the internal pressure $P^2$ can drop constantly with the volume of product dispensed whereas the amount of material dispensed, i.e. dosage per discharge, remains substantially constant as does the discharge pressure $P^3$ required to dispense the product. It will be shown below that the spray pattern of the product dispensed from the system of the invention likewise remains fairly constant over the total contents dispensed.

THE PACKAGE

The products to be dispensed with the system of this invention can be in any fluid-like form, a fluid such as a fragrance, a gel such as a gel toothpaste, a lotion such as a hand lotion, a cream such as a moisturizing cream, or even a powdered material such as an antiperspirant or any combination of these which are suitable for discharge by hydraulic pressure. The system is particularly suitable for the dispensing of pharmaceuticals since the contents once sterilized will remain sterile even as individual dosages are removed.

As to the package—non-pressurized packages such as glass and plastic containers can be used as well as the more traditional packages used heretofore for aerosol dispensing. The package can vary in size from less than 30 milliliters to about one liter. Particularly preferred for products such as fragrances are glass containers ranging in size from between about 30 and about 83 milliliters.

The need for coatings on glass packages is minimized. That is, heretofore fragrances dispensed from aerosols were packaged in glass coated with polyvinylchloride. Since the internal pressure $P^2$ is less, and with certain pressurizing materials such as carbon dioxide, the flammability is diminished dramatically, simpler packaging can be used.

It is critical to the system of the invention that the package described be hermetically sealed from the atmosphere at all times, including during actuation and delivery of the product. The inherent advantage of this feature of the system of the invention includes exclusion of atmospheric oxygen from the package to protect readily oxidizable components of the formulation (such as drug substances, fragrances, flavors and the like) as well as to protect certain substances from microbiological contamination. For example, an aseptically filled or terminally sterilized product using the system of the invention can be maintained in a sterile state throughout its useful life without the necessity of reducing to employment of strong preservative systems. Not only do these preservative substances run the risk of failing to maintain sterility, but they may cause untoward side effects, including tissue irritation (in, for example, dermal formulations and ophthalmic preparations).

The following further illustrates the integrity of the system of the invention: Samples marked A, B and C, respectively, were packed in a 51 milliliter aluminum container, a square 60 milliliter glass bottle, and a 89 milliliter acetal copolymer (Celcon) plastic bottle. The samples prepared were:

A—100% Specially denatured ethyl alcohol 39C (SDA 39C)
B—50:50% mix (SDA 39C: Deionized water)
C—100% Deionized water These solutions shown above were put into the freezer until the temperature reached a range of 32°-35° F. Each cold solution was subjected to a continual flow of $CO_2$ gas through a glass sparging diffuser tube for 3 minutes. The cold $CO_2$ saturated liquid was poured into the appropriate container described above.

Prior to the filling of the container with $CO_2$ treated liquid, the containers had been innoculated with a spore suspension of the test organism, *Bacillus pumilus*. The dispenser was put on each container and crimped. Duplicate samples of each liquid solution in its appropriate container were exposed to 2.67 megarads Co-60 irradiation. Duplicate samples were retained as a control lot. Both treated and control samples were then tested for the presence of bacteriological growth. The following results were observed.

It should be noted that Gamma (Cobalt 60) irradiation discolors glass to give a black color. There did not appear to be any apparent physical change to the rubber, plastic or metal packaging components.

The presence of liquid (either water or alcohol, or a mixture) does not appear to render the radioactive rays ineffective. The treated packages had no growth. The test organisms *Bacillus pumulis* was killed due to the gamma sterilization in glass, aluminum and plastic containers whereas the control samples showed growth of the test organism.

The system of the invention can deliver its contents as liquid stream or as a mist with a wide variety of spray characteristics, even when no hydrocarbon or halogenated hydrocarbon propellant is utilized.

The following Table 2 illustrates a variety of products which could be packaged according to the system of the invention.

It should be understood that the present disclosure is for the purpose of illustration only and includes all modifications or improvements which fall within the scope of the appended claims.

TABLE 2

ILLUSTRATIVE EXAMPLES OF THE SYSTEM OF THE INVENTION

| EXAMPLE NUMBER | PRODUCT TYPE | PRODUCT BASE | PACKAGE TYPE AND SIZE IN MILLILITERS | PRESSURIZING MATERIAL |
|---|---|---|---|---|
| 1 | Cologne | Alcohol and water | Glass 30 | $CO_2$ |
| 2 | Mouth Refresher | Alcohol, water or both | Aluminum 15 | $CO_2$ |
| 3 | Hair Spray | Alcohol | Steel 237 | $N_2O$ |
| 4 | Nasal Inhalent | Water | Glass 15 | $CO_2$ |
| 5 | Throat Spray | Water | Glass 118 | $CO_2$ |
| 6 | Antiperspirant Deodorant Spray | Solvent Dispersion | Steel 177 | Propane |
| 7 | Hand Lotion | Water | Glass or Plastic | $N_2O$ |
| 8 | Insecticide | Solvent | Steel 237 | $CO_2$ |
| 9 | Solid Encapsulated flavors or fragrance | Water/alcohol | Glass 59 | $CO_2$ |
| 10 | Lens Cleaner | Water/alcohol | Aluminum 15 | Butane |

TABLE 2-continued
ILLUSTRATIVE EXAMPLES OF THE SYSTEM OF THE INVENTION

| | | | | | |
|---|---|---|---|---|---|
| 11 | Small Animal Flea Spray | Water emulsion | Steel 177 | | Butane |
| 12 | House Plant Insecticide | Water | Steel 237 | | $CO_2$ |
| 13 | Permanent Wave Solution | Water | Glass 89 | | $N_2O$ |
| 14 | Liquid Butter Pan Spray | Oil or Emulsion | Aluminum 177 | | $CO_2$ |
| 15 | Burn Spray | Water | Aluminum X59 | | $CO_2$ |
| 16 | Athletes Foot Spray | Water | Aluminum 118 | | $CO_2$ |
| 17 | Suntan Lotion | Alcohol/ Oil | Aluminum 118 | | $CO_2$ |
| 18 | After Shave Lotion | High Water Low Alcohol | Glass 235 | | $CO_2$ |
| 19 | Poison Ivy Spray | Water | Glass or Aluminum 59 | | $CO_2$ |

| EXAMPLE NUMBER | TYPE OF FILLING USED | % FILL OF PRODUCT IN CONTAINER BY VOLUME | $P^3$ (atm) | $P^2$ (atm) | DOSAGE IN GRAMS OR MILLITERS |
|---|---|---|---|---|---|
| 1 | Cold sparge | 75 to 80 | 6.5 | 2 | 100 |
| 2 | Impact gassing | 75 to 90 | 6.5 | 2 | 75 |
| 3 | Impact gassing | 70 | 6.5 | 3.7 | 2 |
| 4 | Cold Sparge followed by sterilization | 80 | 6.5 | 1.7 | 50 |
| 5 | Impact gassing followed by sterilization | 75 | 6.5 | 2.7 | 1 |
| 6 | Pressure filling | 80 | 6.5 | 1.7 | 150 |
| 7 | Impact gassing followed by sterilization | 70 | 6.5 | 2.7 | 5 |
| 8 | Impact gassing | 80 | 6.5 | 3 | 1 |
| 9 | Impact gassing | 80 | 6.5 | 2 | 100 |
| 10 | Pressure filling | 80 | 6.5 | 1.7 | 100 |
| 11 | Pressure filling | 70 | 6.5 | 1.7 | 1 |
| 12 | Impact gassing | 70 | 6.5 | 2.7 | 1 |
| 13 | Impact gassing | 75 | 6.5 | 2.4 | 1 |
| 14 | Impact gassing | 80 | 6.5 | 2.7 | 2 |
| 15 | Sparge followed by sterilization | 80 | 6.5 | 2 | 0.1 |
| 16 | Impact gassing | 80 | 6.5 | 2.7 | 0.10 |
| 17 | Impact gassing | 70 | 6.5 | 2.7 | 0.15 |
| 18 | Impact gassing | 80 | 6.5 | 2 | 0.1 |
| 19 | Impact gassing | 80 | 6.5 | 2 | 0.1 |

| EXAMPLE NUMBER | PRODUCT ADVANTAGE |
|---|---|
| 1 | Oxidation of key notes eliminated |
| 2 | Oxidation eliminated; Sterility maintained |
| 3 | Oxidation eliminated; Spray controlled |
| 4 | Oxidation eliminated; sterility maintained Preservatives eliminated |
| 5 | Sterility maintained; oxidation eliminated Preservatives eliminated |
| 6 | Flammability decreased; chill factor reduced |
| 7 | Sterility maintained; no preservatives required |
| 8 | Moisture avoided; flammability reduced Particle size controlled |
| 9 | Oxidation eliminated; clogging prevented |
| 10 | Controlled spray pattern; flammability decreased |
| 11 | Eliminates frightening noise of aerosol |
| 12 | Eliminates phytotoxic solvents and propellants |
| 13 | Metered amount, ease of use Spray at any angle |
| 14 | Sterility intact; metered amount; ease of use; oxidation eliminated; reduced flammability |
| 15 | No solvent burn (alc) Metered dose; sterile and without preservatives |
| 16 | No solvent burn; sterile |
| 17 | Neatness, convenience; low pressure (hot sun); Spray at any angle |

TABLE 2-continued

ILLUSTRATIVE EXAMPLES OF THE SYSTEM OF THE INVENTION

| | |
|---|---|
| 18 | Fragrance; Free of oxidation |
| | Decrease alcohol burning |
| 19 | No burning; no preservatives |

I claim:

1. A pump especially adapted to be mounted in and on an hermetically sealed container and to remove and discharge fluid contained therein at an elevated discharge pressure, said pump having a discharge chamber, an intake chamber and a reciprocating valve body characterized in that the said intake chamber is mounted on said valve body and is contained entirely within said discharge chamber, said valve body is spring loaded, said discharge chamber comprises a housing having an open end and a closed end mounted on said container, a cooperating piston having an open ended bottom mounted in the open end of said housing, said spring loaded valve body is positioned between said housing and said piston, an upstanding stem is provided in the closed end of said housing and the lower end of said valve body comprises an open ended chamber forming said intake chamber and is mounted on said stem in sliding but sealed relation thereto, whereby said pump is pressure actuated and said discharge pressure is substantially independent of the pressure within said hermetically sealed container.

2. A pump as claimed in claim 1 further characterized in that said upstanding stem is provided with an induction passage extending therethrough and communicating between the interior of said container and said intake chamber.

3. A pump as claimed in claim 2 further characterized in that said valve body is provided with an intermediate valve chamber, a valve port communicating between said intake chamber and said valve chamber, a movable valve element within said chamber adapted to seal said valve port and at least one port in the wall of said valve chamber remote from said valve port communicating with said discharge chamber.

4. A pump as claimed in claim 3 further characterized in that said spring is mounted within said intake chamber with one end mounted on a shoulder provided on said upstanding stem and the other end surrounding said valve port.

5. A pump as claimed in claim 4 further characterized in that said piston is provided with a discharge passage and a valve seat surrounding said discharge passage and said valve body is provided at the end remote from said intake chamber with a valve stem having an end portion adapted to mate with said valve seat and to seal said discharge passage.

6. A pump as claimed in claim 5 further characterized in that the piston is provided with a separable actuator having a discharge passage mating with the discharge passage in said piston, a nozzle member and a shoulder member adapted to come into contact with an element mounted on said container and thereby limit the stroke of said piston.

7. A pump as claimed in claim 6 further characterized in that the diameter of said valve stem is substantially the same as the diameter of said upstanding stem and the outside diameter of said intake chamber is substantially in excess thereof.

8. A pump as claimed in claim 7 further characterized in that said upstanding stem is provided with an axially mounted extension at the end thereof adapted when the piston, in the absence of said actuator, is depressed further than the position permitted by said actuator to extend through said valve port and to unseat said valve element thereby permitting said sealed container to be charged through said discharge passage.

9. A pressure actuated pump as claimed in claim 1 for the metered dispensing of a fluid contained in a hermetically sealed container at a pressure $P^2$, said pump particularly adapted for use in situations wherein said pressure $P^2$ is at a relatively low value initially and decreases in value as the fluid is removed from said sealed container, said pump characterized by the following:

a housing fitted into said container in sealed relating thereto with an open-ended portion extending outwardly of said container, and a close-ended portion extending inwardly of said container;

said close-ended portion being provided with an upstanding stem, said stem having an induction passage extending axially thereof and therethrough and through the bottom wall of said chamber, said induction passage communicating with a dip tube extending within said container for removal of fluid therefrom;

a piston fitted into said housing, said piston having an open-ended bottom portion the periphery of which is in sealed relation with the inner wall of the open-ended portion of said housing in sliding relation thereto and a top portion provided with a discharge passage extending therethrough and a valve seat surrounding said passage at the inner end thereof;

said piston and said housing in combination forming a discharge chamber, said housing being provided at its upper end with an inwardly extending shoulder retaining said piston therein;

a valve means within said chamber, said valve means having at one end a valve stem provided with an end portion adapted to mate with said valve seat and when in mating position to seal said discharge chamber from said discharge passage, at the other end a hollow intake chamber adapted to surround said upstanding stem in sealed but sliding relation thereto, and intermediate the two ends, a valve chamber, said valve chamber provided with a valve port communicating with said intake chamber, a movable valve member adapted to seal with valve port, and one or more ports remote from said valve port communicating between said valve chamber and said discharge chamber;

a spring member extending internally of said intake chamber with one end shouldered on said upstanding stem and the other end surrounding said valve port, said spring member normally urging said valve port away from said stem and thereby urging said valve stem against said valve seat and said piston against said shoulder;

and a depressible external actuator mounted on said piston and provided with a passage therethrough communicating with said discharge passage in said piston and terminating in an external discharge orifice, whereupon when pressure is applied to said actuator, said actuator depresses said piston relative to said housing thereby decreasing the volume of said discharge chamber and increasing the pressure $P^1$ in the fluid contained therein until said pressure $P^1$ reaches $P^3$, the discharge pressure, whereupon the said valve will move away from its associated valve seat against the pressure imposed by said spring, thereby discharging the fluid contained in said discharge chamber through said external discharge orifice, and whereby, upon release of said pressure upon said actuator subsequent to said discharge, said spring acting through said valve stem and valve seat urges said piston toward said shoulder thereby increasing the volume of said discharge chamber reducing the pressure $P^1$ therein to less than $P^2$ the pressure in said sealed container, thereby moving said movable valve member from its associated seat admitting fluid from said sealed container until such time as said fluid fills said discharge chamber, said piston abuts said shoulder, and $P^1$ equals $P^2$, $P^3$ being in excess of and substantially independent of $P^2$.

10. A pump as claimed in claim 9 further characterized in that said upstanding stem is provided with an axially oriented extension at the free end thereof, said extension adapted to extend through said valve port located between said intake chamber and said valve chamber and to unseat said movable valve member associated with said valve port when said piston is depressed to a position beyond that permitted when the actuator is assembled thereto, whereby during a filling operation after the pump has been assembled with the container and the seal formed and before the actuator has been placed on said piston, said container can be charged through said discharge passage by depressing the piston farther than permitted by the presence of the actuator.

11. A system for the metered dispensing of a product comprising in combination an hermetically sealed package containing said product, a pressurizing agent and a pump as claimed in any one of claims 1 through 10.

* * * * *